(12) United States Patent
Goela

(10) Patent No.: US 6,221,482 B1
(45) Date of Patent: Apr. 24, 2001

(54) LOW STRESS, WATER-CLEAR ZINC SULFIDE

(75) Inventor: Jitendra S. Goela, Andover, MA (US)

(73) Assignee: CVD Inc., Woburn, MA (US)

(*) Notice: Subject to any disclaimer, the term of this patent is extended or adjusted under 35 U.S.C. 154(b) by 0 days.

(21) Appl. No.: 09/287,893

(22) Filed: Apr. 7, 1999

(51) Int. Cl.⁷ .................. B29C 71/02; C01G 9/08
(52) U.S. Cl. .................. 428/332; 428/333; 428/704; 264/234; 264/237
(58) Field of Search .................. 428/332, 333, 428/704; 423/566.1; 264/234, 237, 81

(56) References Cited

U.S. PATENT DOCUMENTS

| | | | |
|---|---|---|---|
| 4,944,900 | 7/1990 | Willingham et al. | 264/1.2 |
| 4,978,577 | 12/1990 | Purohit et al. | 428/409 |
| 5,077,092 | 12/1991 | Smith et al. | 427/255.2 |
| 5,686,195 | 11/1997 | Taylor et al. | 428/698 |
| 6,083,561 * | 8/2000 | Goela et al. | |
| 6,111,689 * | 8/2000 | Shibata | |

OTHER PUBLICATIONS

U.S. Patent application Ser. No. 09/018,969, filed Feb. 5, 1998 by Goela, Jitendra et al. (copy not included—previously of record with U.S. Patent and Trademark Office).

\* cited by examiner

Primary Examiner—Deborah Jones
Assistant Examiner—Jason Savage
(74) Attorney, Agent, or Firm—Gerald K. White; John J. Piskorski

(57) ABSTRACT

The machinability of water-clear zinc sulfide articles produced by chemical vapor deposition and high temperature, high isostatic pressure (HIP) treatment is enhanced by extending the time over which the article is cooled following the HIP treatment. The resulting low stress, water-clear zinc sulfide articles can be more accurately finished/machined to precise shapes, such as are required in optical applications, than was previously possible.

21 Claims, 1 Drawing Sheet

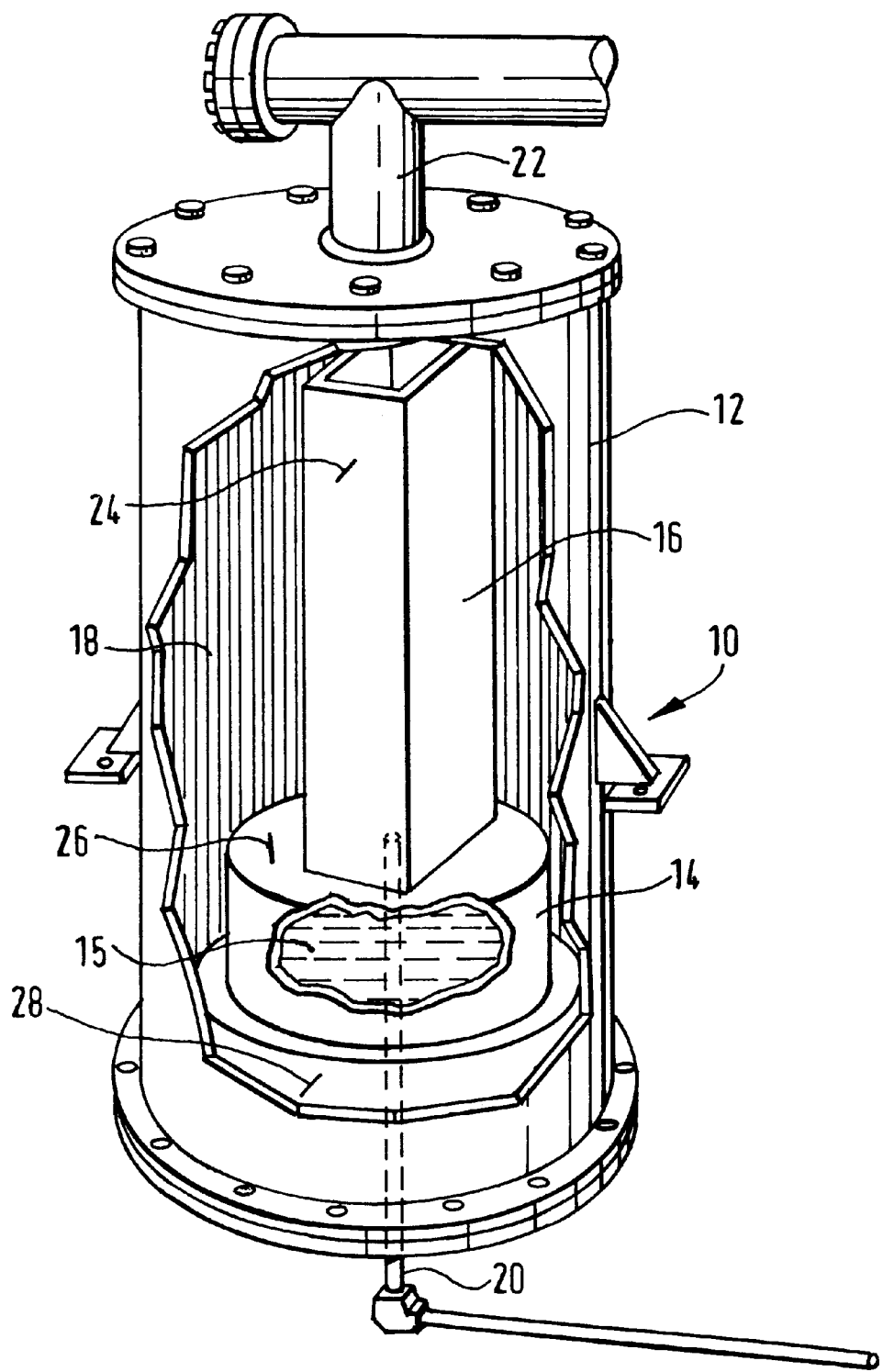

LOW STRESS, WATER-CLEAR ZINC SULFIDE

BACKGROUND OF THE INVENTION

1. Field of the Invention

Zinc sulfide is a durable material which is intrinsically transparent to relatively long electromagnetic wavelengths in the far-infrared region. These properties contribute to its use in applications which require infrared transmission capability such as in infrared detectors and missile domes. Such zinc sulfide articles are typically produced by chemical vapor deposition (CVD) or hot pressing techniques. These techniques result in forms which are generally opaque and not functionally transparent in the visible or near-infrared regions of the electromagnetic spectrum. Hot-isostatic pressing (HIP) has been found to sufficiently improve the transparency of zinc sulfide articles in the visible and near-ultraviolet regions that these forms can be used in applications requiring multi-spectral capability, such as in tank and aircraft windows. However, difficulties in the final shaping/machining of these windows have compromised the capability of providing them in the precisely contoured shapes required for some applications, such as for some optical components. These difficulties have been particularly pronounced with attempts to fabricate relatively large articles. This invention relates to improvements in the CVD-Hipping process which have facilitated the consistent fabrication of precisely shaped, low stress, water-clear zinc sulfide articles.

2. Description of Related Art

Chemical vapor deposition has been used to produce zinc sulfide in bulk form or in the form of a layered coating on a substrate. Typically such production involves the reaction of $H_2S$ with vaporized zinc in proximity to either a substrate or a mandrel box on which the zinc sulfide deposits, such as is described in U.S. Pat. No. 5,686,195. The zinc sulfide deposits produced by this CVD method generally exhibit many inclusions and poor transmission in the visible and near-infrared regions of the electromagnetic spectrum. As described in U.S. Pat. No. 4,944,900, the transmission properties in these regions can be substantially improved by hot isostatic pressing (HIP) of the form produced by CVD.

A moderately clear ZnS has been commercially produced by a two-step process. First, elemental zinc vapors are reacted with hydrogen sulfide at a $H_2S/Zn$ molar ratio of 1, a mandrel (substrate) temperature of 735° C. and an absolute pressure of 35 torr, in a CVD reactor. Zinc sulfide is deposited on the mandrel until a deposit of the desired thickness is produced. The deposit is separated from the mandrel to provide a zinc sulfide form which is then HIP treated for up to 100 hours at 900–1000° C. and pressures of 15,000–30,000 psi. A recent application, Ser. No. 09/018,969 filed Feb. 5, 1998, describes an improvement of this process which reduced the number of visible inclusions present in the deposited form and provided a corresponding improved clarity of images viewed through articles prepared from these forms. The improved clarity of the product, referred to as water-clear zinc sulfide, has resulted in an expanded range of applications including some which require physical shaping/grinding to very precise final contours. Customers, however, have complained of difficulty accurately machining windows from 15–20 inch forms of water-clear zinc sulfide to a specification which required a figure of less than one tenth of a wave RMS (root mean square) at a wavelength of 632.8 nm. Exceeding this specification resulted in product windows which demonstrated unacceptable distortion of the transmitted images.

It was suspected the machining difficulties were related to a high level of stress birefringence, in the range of 80–240 nm/cm., which was measured in large water-clear zinc sulfide forms. These high stress birefringence values were generally measured near the edges of the forms, while relatively low values were measured near the forms' centers. Since considerable machining of the as deposited silicon carbide form, to reduce both its thickness and its edges, is required to result in the desired window shape, it was suspected such machining was responsible for the high stress birefringence values. Careful control of the machining and etching process provided a limited reduction of the total stress birefringence measured in forms; however, the stress birefringence per unit of window thickness was not appreciably reduced. A further attempt to reduce the stress values involved repeating the HIP treatment and controlling the cool down to less than 31° C. per hour. The second HIP treatment reduced the stress birefringence at the edges from a value in excess of 100 nm/cm to about 70 nm/cm. While this second HIP treatment demonstrated a reduction in the stress value, it was not sufficient to provide the required machinability. Providing a series of HIP treatments to achieve a satisfactory level of stress birefringence was not considered an economically viable approach, since each HIP treatment requires heat soaking the form at high temperature and high pressure for up to 100 hours in a fairly large, high temperature rated, pressure vessel.

Accordingly, there is a need for forms of machinable, low stress, water-clear zinc sulfide, particularly relatively large forms, i.e. those having thicknesses greater than ½ inch and/or a maximum face dimension (length and/or width) greater than 10 inches. There is also a corresponding need for a process capable of consistently producing such low stress, water-clear zinc sulfide forms.

SUMMARY OF THE INVENTION

The invention is an improvement of the process of producing water-clear zinc sulfide by chemical vapor deposition and hot isostatic pressing which permits the production of low stress, water-clear forms which are capable of being formed/machined into precision windows and other optical articles. The invention also embraces the low stress, water-clear zinc forms/articles enabled by the improved process.

The improved process involves chemical vapor deposition of zinc sulfide, produced by the reaction of hydrogen sulfide with zinc vapor, on a substrate and the subsequent removal of the zinc sulfide deposited form from the substrate. The form is then subjected to high temperature and high isostatic pressure (Hipping) for an extended period of time. At the conclusion of the high temperature treatment, the form is allowed to cool to room temperature under controlled conditions which maintain a cooling rate of less than 50° C. per hour or, preferably, less than 31° C. Pressure is maintained on the cooling form at least until the temperature is reduced to 500° C.

The improved low stress, water-clear zinc sulfide forms/articles produced by this process are characterized by stress birefringence values no greater than 40 nm/cm, and, preferably no greater than 20 nm/cm.

BRIEF DESCRIPTION OF THE DRAWING

The drawing schematically illustrates a furnace in which the chemical vapor deposition steps of the present inventive process can be conducted.

DETAILED DESCRIPTION OF THE INVENTION

Deposits of zinc sulfide are produced in a furnace like that schematically illustrated in the FIGURE. The furnace 10 is enclosed in a vertically oriented water cooled stainless steel vacuum chamber housing 12. A graphite retort 14 containing molten zinc 15 and provided with a first heating means, such as resistance and/or radiant heating elements, is provided near the bottom of the chamber 12. A rectangular graphite mandrel 16 is arranged above the zinc retort 14 with its interior in flow communication with the retort. Second heating means 18, such as resistance heaters, capable of heating the graphite mandrel are provided around the mandrel's exterior. A gas injector 20 provides hydrogen sulfide ($H_2S$) and an inert carrier gas to the lower portion of the mandrel's interior. The gas exhaust 22 at the top of the housing 12 is operatively connected to a filtration system (not shown) to remove particulates, then to a vacuum source, such as a vacuum pump (not shown) and finally to a scrubber (not shown) to remove unreacted $H_2S$ and any other toxic products. The temperature of the mandrel is measured by a thermocouple 24 touching the mandrel at its external surface. The temperature of the zinc in the retort is measured by averaging the temperature measurements of two thermocouples, one 26 touching the upper portion of the retort's wall (above/near the level of molten zinc) and another thermocouple 28 extending to the lower portion of the retort's wall (below the level of molten zinc).

In operation, elemental zinc is vaporized in the zinc retort 14 at a temperature greater than 575° C. The vaporized zinc is mixed with injected $H_2S$ and a carrier gas as they enter the mandrel 16 from the injector 20. The mixed gases are caused to flow through the interior of the graphite mandrel wherein they contact the heated interior surface of the mandrel causing the zinc and $H_2S$ to react forming ZnS on the interior surfaces of the mandrel 16. The carrier gas and any gaseous or entrained reaction products are removed from the chamber through the gas exhaust 22 and are then processed through the filtration and scrubbing systems. Once started, the process is continued until the desired thickness of zinc sulfide is deposited on the graphite mandrel, which takes more than 15 hours and can take up to 1100 hours. Typically, deposition is continued for between 100 and 600 hours. When the desired thickness is achieved, the gas flow through the gas injector 20 is discontinued, the first heating means is turned down, the second heating means 18 is turned off, the chamber housing 12 is opened and the graphite mandrel 16 is removed. The zinc sulfide sheets deposited on the interior walls of the mandrel are then removed therefrom and cut into sheets of the desired size.

The sheets are machined to remove graphite contaminants on the substrate, or mandrel, side and are machined to smooth the deposition side. The sheets are then treated (Hipped) by a HIP process which typically subjects them to high temperature (greater than 700° C., preferably 900° to 1000° C.) and isostatic high pressure (from 5,000 to 30,000 psi, preferably from 15,000 to 30,000 psi) for an extended time of up to 150 hours, typically 70 to 100 hours.

The HIP process involves wrapping the machined sheets in an inert foil, such as a platinum foil, and positioning the wrapped sheets in a graphite crucible in a conventional HIP furnace. The furnace is first evacuated and then pressurized with an inert gas, such as argon. Heating is begun and the temperature allowed to rise to its set point, where the temperature and pressure stabilize and are maintained for the desired extended treatment time. Upon completion of the desired treatment time, the heating is discontinued and the wrapped sheets allowed to cool. The pressure is released after the temperature falls below 500° C.

Prior to this invention, the rate of cooling following HIP treatment was generally set with concern for maximizing the throughput of the HIP facility. Accordingly, the HIP treated forms were allowed to cool relatively rapidly, i.e. at rates in excess of 100° C. per hour, particularly at the initiation of the cooling cycle. The present invention involves the discovery that by extending the cooling time by controlling the rate of cooling to less than 50° C. per hour, and, preferably, less than 31° C. per hour, forms having stress birefringence values no greater than 40 nm/cm, preferably, no greater than 20 nm/cm, and capable of final shaping/polishing as precisely shaped optical components, are produced.

While the improved process is advantageously used in the production of any size form of low stress zinc sulfide, it is particularly beneficial when used to produce the relatively large forms which have previously been the most difficult to finish in precisely contoured shapes, such as the more precision shaped articles required in optical applications. Generally, these relatively large forms have a deposited thickness of ¼ inch or greater, and/or they have a maximum face dimension (length or width) of 10 inches or greater. The improved process is particularly important for the production of forms having a thickness of ¾ inch or greater and/or a maximum face dimension of 20 inches or greater.

EXAMPLE NO. 1

Zinc sulfide forms were produced by chemical vapor deposition in a furnace similar to that illustrated in FIG. 1. Initially, the furnace was flushed with an inert gas and pressure in the furnace was brought to 35 torr. The mandrel 16 was brought to an initial temperature of 700° C. and zinc in the retort 14 was heated to a temperature in excess of 575° C. The flow of argon and hydrogen sulfide through injector 20 was initiated at flow rates of 113.1 slpm (standard liters per minute) Ar and 9.3 slpm $H_2S$. The Zn vapor was gradually brought to its target flow rate of 12.43 slpm by increasing the zinc retort control temperature, measured near the top of the retort, from 640° C. to 660° C. over the first 38 hours of deposition. Over the same time period the temperature measured near the bottom of the retort increased from 612° C. to 625° C., and the average of the two temperatures increased from 626° C. 642.5° C. Thereafter, the retort control temperature increased, as required to maintain the Zn vapor flow rate of 12.43 slpm, until it reached 680° C. at hour 615 of the deposition. The mandrel temperature was ramped down from its initial 700° C. temperature to its final target value of 670° C. over the first 20 hours of the deposition.

The deposition continued for 650 hours resulting in a 797.7 Kg ZnS deposit on the mandrel. The deposit was formed into plates as it was removed from the mandrel. The plates were machined on the substrate side to remove graphite contaminants and on the deposit side to smooth the surface. They were then wrapped in platinum foil and vertically arranged in a graphite crucible which was then loaded in a HIP chamber. Heating of the crucible was initiated and an isostatic pressure of greater than 14,000 psi was established in the HIP chamber by the time the temperature reached 500° C. The temperature rose to 990° C. and that temperature and a pressure of 15,000 psi was maintained for 90 hours. The crucible was then cooled to room temperature at a rate controlled to not exceed 31° C. per hour. The pressure was reduced to atmospheric after the temperature was reduced to less than 500° C.

After removal from the crucible, the plates were lapped and polished. Test samples (1 inch diameter by 10 mm thick), which were prepared from the same CVD deposit and which were included with the plates during the HIP treatment, were inspected for inclusions and determined to be of excellent quality with no inclusion greater than 0.1 mm in diameter detected. Scatter values of the same samples were measured with a scatterometer at a half cone angle of 0.5 to 3 degrees from the beam direction of a He-Ne laser (wavelength of 632.8 nm) source. The scatter values varied in the range of 3.7 to 5.83 cm$^{-1}$. Visible transmission values measured on two samples with a UV-vis spectrophotometer were in the range of 56.3% to 59.1% for a 450 nm wavelength and in the range of 62.4% to 64.8% for a 550nm wavelength.

Six plates produced during the run were characterized for stress birefringence. Plates A, B, C and D were approximately 19 inches ×17 inches ×0.85 inch and were intended for processing into 16 inch diameter windows. Plates E and F were approximately 20 inches ×19 inches ×0.85 inch and were intended for processing into 18 inch diameter windows. Measurements were made with a hand held Soleil-Babinet compensator. The measurements were taken at specified distances from the center along several radii R extending from the center of the plate. The measurements were averaged and reported in Table 1. The values reported under "Sides" are the average of six measurements, three along each of the shorter sides. All of the stress birefringence values are ≦40 nm/cm. The data establishes that large, low stress, low scatter, high transmission, water-clear zinc sulfide plates were produced by the improved inventive process.

TABLE 1

| | Stress Birefringence Measurements (nm/cm) | | | | | |
|---|---|---|---|---|---|---|
| Window | ¼ R | ½ R | ¾ R | Full R | Sides | Average |
| A | 3 | 4 | 6 | 11 | 9 | 6.6 |
| B | 2 | 2 | 2 | 7 | 13 | 5.2 |
| C | 2 | 7 | 8 | 16 | 15 | 9.6 |
| D | 2 | 2 | 3 | 5 | 9 | 4.2 |
| E | 2 | 5 | 6 | 12 | 17 | 8.4 |
| F | 5 | 15 | 19 | 40 | 25 | 20.8 |

EXAMPLE NO. 2

A further deposit of zinc sulfide was prepared by chemical vapor deposition in a manner similar to the chemical vapor deposition of Example No. 1. In this run the retort control temperature was ramped up from 645° to 665° C. and the temperature measured near the bottom of the retort was increased from 615° to 627° C. during the first 54 hours of the deposition. The mandrel temperature was ramped down from its starting temperature of 690° to 670° C. during the first 18 hours of the deposition. The flow rate of zinc was established at 12.6 slpm and the $H_2S/Zn$ molar ratio was controlled at 0.74. Otherwise, the conditions were as in Example No. 1. The run continued for 650 hours.

One large rectangular form and several one and two inch diameter samples were prepared from the deposit and were HIP treated under the same conditions as were used in Example No. 1, except the Hipping duration was decreased to 70 hours and the treatment was conducted at a different location.

The large form resulting from the HIP treatment was intended to provide sufficient material to yield an 18 inch diameter window. It was polished and characterized for stress birefringence by multiple measurements at designated locations spaced from the center of the form along several radii R (in this case, R=9 inches) and at three points along its short sides. The measurements were averaged and reported in Table 2. All of the averaged measurements are less than 20 nm/cm. The samples demonstrated forward scatter values and visible transmission values consistent with the Example No. 1 values. Likewise, no inclusions greater than 0.1 mm were detected in the samples.

TABLE 2

| Measurement Location | Number of Measurements | Avg. Stress Birefringence (nm/cm) |
|---|---|---|
| Full R | 8 | 13 |
| ¾ R | 8 | 5 |
| ½ R | 4 | 1 |
| ¼ R | 4 | 0 |
| Short Sides | 6 | 17 |
| Average | | 6 |

A number of zinc sulfide forms produced prior to the present invention by chemical vapor deposition and HIP treatment, with cool down from the HIP treatment at a rate initially in excess of 100° C./hour, were characterized for stress birefringence. Measurements were taken at points along two radii extending from the center of the form approximately 90 degrees apart. The typical window thickness was 1.45 cm. The results of the two data sets were averaged and reported in Table 3. Each of the forms demonstrated stress birefringence values of 95 nm/cm or greater.

TABLE 3

| | Stress Birefringence in 4 ZnS Forms Produced Prior To The Present Invention | | | |
|---|---|---|---|---|
| Measurement Location, | Stress Birefringence Measurements (nm/cm) | | | |
| Radius (inch) | Window No. 1 | Window No. 2 | Window No. 3 | Window No. 4 |
| 8.5 | 177 | 122 | 144 | 95 |
| 8.0 | 150 | 105 | 120 | 88 |
| 7.0 | 95 | 70 | 100 | 65 |
| 6.0 | 68 | 56 | 79 | 49 |
| 5.0 | 48 | 38 | 65 | 34 |
| 4.0 | 30 | 25 | 48 | 20 |
| 3.0 | 20 | 16 | 34 | 14 |
| 2.0 | 12 | 10 | 14 | 7 |
| 0.0 | 0 | 0 | 0 | 0 |
| Average | 60.4 | 44.8 | 61.5 | 38.4 |

Accordingly, it is believed that the inventive process has enabled, for the first time, the production of low stress (i.e. less than 40 nm/cm), low scatter, high transmission, water-clear zinc sulfide.

The foregoing is provided to enable workers in the art to practice the invention and to describe what is presently considered to be the best mode of practicing the invention. The scope of the invention is defined by the following claims.

I claim:

1. A method of preparing a low stress zinc sulfide form comprising:

forming a deposit of zinc sulfide on a substrate, separating said deposit from said substrate as a zinc sulfide form, heating said form to a temperature in excess of 700° C., providing an isostatic pressure of at least 5000 psi on said form, maintaining said temperature and said pressure for at least 24 hours, and cooling said form from said temperature at a rate of less than 50° C. per hour.

2. The method of claim 1, wherein said zinc sulfide deposit results from the reaction of hydrogen sulfide with vaporized zinc.

3. The method of claim 1, wherein said temperature is in the range of 900° to 1050° C.

4. The method of claim 1, wherein said pressure is in the range of 15,000 to 30,000 psi.

5. The method of claim 1, wherein said temperature and said pressure are maintained for 50 to 150 hours.

6. The method of claim 1, wherein said zinc sulfide form is at least ¼ of an inch thick.

7. The method of claim 1, wherein said zinc sulfide form has at least one dimension in excess of 10 inches.

8. The method of claim 7, wherein said zinc sulfide form has at least one dimension in excess of 15 inches.

9. The method of claim 1, wherein the stress birefringence values of said low stress zinc sulfide form do not exceed 40 nm/cm.

10. The method of claim 9, wherein said stress birefringence values do not exceed 20 nm/cm.

11. The method of claim 1, wherein said rate is less than 31° C. per hour.

12. The method of claim 11, wherein said zinc sulfide form has at least one dimension in excess of 10 inches.

13. The method of claim 11, wherein said zinc sulfide form is at least ¼ of an inch thick.

14. A zinc sulfide article produced by the method of claim 1, having at least one dimension in excess of ten inches and free of stress birefringence values exceeding 40 nm/cm.

15. The zinc sulfide article of claim 14, further characterized by being free of inclusions greater than 0.1 mm in diameter.

16. The zinc sulfide article of claim 14, further characterized by 450 nm wavelength transmission values in the range of 56 to 60%.

17. The zinc sulfide article of claim 14, further characterized by 550 nm wavelength transmission values in the range of 62 to 65%.

18. The zinc sulfide article of claim 14, further characterized by having forward scatter values of 3.5 to 6.0 cm$^{-1}$ when measured with a He-Ne laser.

19. The zinc sulfide article of claim 14, having a thickness of at least ¼ inch.

20. The zinc sulfide article of claim 14 having at least one dimension in excess of 15 inches.

21. A zinc sulfide article according to claim 14 which is free of stress birefringence values in excess of 20 nm/cm.

* * * * *